(12) United States Patent
Interrante et al.

(10) Patent No.: US 8,487,447 B2
(45) Date of Patent: Jul. 16, 2013

(54) SEMICONDUCTOR STRUCTURE HAVING OFFSET PASSIVATION TO REDUCE ELECTROMIGRATION

(75) Inventors: Mario J. Interrante, New Paltz, NY (US); Gary LaFontant, Elmont, NY (US); Michael J. Shapiro, Austin, TX (US); Thomas A. Wassick, LaGrangeville, NY (US); Bucknell C. Webb, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/111,283

(22) Filed: May 19, 2011

(65) Prior Publication Data

US 2012/0292779 A1    Nov. 22, 2012

(51) Int. Cl.
*H01L 23/48*    (2006.01)
*H01L 23/52*    (2006.01)
*H01L 29/40*    (2006.01)

(52) U.S. Cl.
USPC ............ 257/774; 257/737; 257/E21.476; 257/E27.013; 257/621; 438/629; 438/637; 438/639; 438/640; 438/667

(58) Field of Classification Search
USPC ............ 257/774, 737, E21.476, E27.013, 257/621; 438/629, 637, 639, 640, 667, 668, 438/672, 675, 700, 701, 713, 978
See application file for complete search history.

(56) References Cited

U.S. PATENT DOCUMENTS

| | | | |
|---|---|---|---|
| 6,822,327 B1 | 11/2004 | Mithal et al. | |
| 6,919,639 B2 | 7/2005 | Ho et al. | |
| 7,199,035 B2 | 4/2007 | Chuang et al. | |
| 7,501,708 B2 | 3/2009 | Andry et al. | |
| 7,569,475 B2 | 8/2009 | Yang et al. | |
| 2006/0211167 A1 | 9/2006 | Knickerbocker et al. | |
| 2008/0296763 A1 | 12/2008 | Chen et al. | |
| 2009/0032951 A1 | 2/2009 | Andry et al. | |
| 2009/0095519 A1 | 4/2009 | Daubenspeck et al. | |
| 2010/0164116 A1 | 7/2010 | Li et al. | |
| 2011/0108977 A1 | 5/2011 | Lin et al. | |
| 2012/0067628 A1* | 3/2012 | Nakai | 174/257 |
| 2012/0074585 A1* | 3/2012 | Koo et al. | 257/774 |
| 2012/0104561 A1* | 5/2012 | Kuo | 257/621 |

OTHER PUBLICATIONS

P. S. Andry et al., "Fabrication and characterization of robust through-silicon vias for silicon-carrier applications," IBM Journal of Research and Development , vol. 52, Issue 6, Nov. 2008, 571-581.
S. L. Wright et al., "Reliability testing of through-silicon vias for high-current 3D applications," 58th Electronic Components and Technology Conference, ECTC 2008, May 27-30, 2008, pp. 879-883.
Search Report; Sep. 26, 2012 by Gareth Lewis.

* cited by examiner

*Primary Examiner* — Cathy N Lam
(74) *Attorney, Agent, or Firm* — Ira D. Blecker; Katherine S. Brown

(57) ABSTRACT

A semiconductor structure which includes a plurality of stacked semiconductor chips in a three dimensional configuration. There is a first semiconductor chip in contact with a second semiconductor chip. The first semiconductor chip includes a through silicon via (TSV) extending through the first semiconductor chip; an electrically conducting pad at a surface of the first semiconductor chip, the TSV terminating in contact at a first side of the electrically conducting pad; a passivation layer covering the electrically conducting pad, the passivation layer having a plurality of openings; and a plurality of electrically conducting structures formed in the plurality of openings and in contact with a second side of the electrically conducting pad, the contact of the plurality of electrically conducting structures with the electrically conducting pad being offset with respect to the contact of the TSV with the electrically conducting pad.

16 Claims, 4 Drawing Sheets

SEMICONDUCTOR STRUCTURE HAVING OFFSET PASSIVATION TO REDUCE ELECTROMIGRATION

BACKGROUND

The exemplary embodiments relate generally to three dimensional semiconductor integration structures and, more particularly, relate to three dimensional semiconductor integration structures having through silicon via structures and offset passivation to reduce electromigration.

In semiconductor technologies, a through silicon via (TSV), also known as a through substrate via, is a conductive feature formed in a semiconductor substrate (wafer/chip). The TSV feature vertically passes through the semiconductor substrate, providing a stacked wafer/chip packaging method and allowing electrical connection between circuits in separate wafers or chips.

There are a number of ways to create a TSV. Typically, a hole is etched into the semiconductor substrate, and sometimes through an interconnect structure as well. The hole may then be lined with various isolating layers and/or various metal layers. The hole is then filled with the conductive material, typically copper (Cu), which becomes the major part of a TSV. Some TSVs are in electrical contact with the semiconductor substrate, while others are electrically isolated. Any material within the etched hole may be considered part of the TSV, so the complete TSV may include the Cu, plus a liner, and perhaps insulating layers.

The TSV may terminate on a bonding pad. A solder ball, also called a C-4 connection, may contact the bonding pad and join the bonding pad of one semiconductor chip to a bonding pad of another semiconductor chip or a package. In this manner, multiple chips may be stacked on a package to form a three dimensional silicon integration structure.

Though a conventional via shares some similarity of name with a through silicon via, it is a substantially different structure bearing little relationship. A conventional via connects wires within a die or an interconnect structure (such as a package) and may only pass through a single dielectric layer. Conventional vias are on the order of the sizes of the metal lines to which they connect, generally within a factor of three to four times the thickness in the worst case. A TSV, having to pass through an entire semiconductor substrate, may be as much as thirty times larger in diameter than the conventional via.

Electromigration can take place in any conductive material carrying a current, such as a TSV structure or a metallization layer. Electromigration is the transport of material caused by the gradual movement of electrons in a conductor. This transport of material may eventually cause a gap, or a void, in the conductive material leading to higher resistance at other connection points, or an open circuit failure when all connection is lost. To reduce the occurrence of such voids, there are rules limiting the amount of current allowed in a conductive material. Such electromigration ground rules are well known within the art.

BRIEF SUMMARY

The various advantages and purposes of the exemplary embodiments as described above and hereafter are achieved by providing, according to a first aspect of the exemplary embodiments, a semiconductor structure which includes a through silicon via (TSV) extending through the semiconductor structure; an electrically conducting pad at a surface of the semiconductor structure, the TSV terminating in contact at a first side of the electrically conducting pad; a passivation layer covering the electrically conducting pad, the passivation layer having a plurality of openings; and a plurality of electrically conducting structures formed in the plurality of openings and in contact with a second side of the electrically conducting pad, the contact of the plurality of electrically conducting structures with the electrically conducting pad being offset with respect to the contact of the TSV with the electrically conducting pad.

According to a second aspect of the exemplary embodiments, there is provided a semiconductor structure which includes a plurality of stacked semiconductor chips in a three dimensional configuration. There is a first semiconductor chip in contact with a second semiconductor chip. The first semiconductor chip includes a through silicon via (TSV) extending through the first semiconductor chip; an electrically conducting pad at a surface of the first semiconductor chip, the TSV terminating in contact at a first side of the electrically conducting pad; a passivation layer covering the electrically conducting pad, the passivation layer having a plurality of openings; and a plurality of electrically conducting structures formed in the plurality of openings and in contact with a second side of the electrically conducting pad, the contact of the plurality of electrically conducting structures with the electrically conducting pad being offset with respect to the contact of the TSV with the electrically conducting pad.

According to a third aspect of the exemplary embodiments, there is provided a method of reducing electromigration in a semiconductor chip. The method including: obtaining a semiconductor structure comprising a through silicon via (TSV) extending through the semiconductor structure, an electrically conducting pad at a surface of the semiconductor structure, the TSV terminating in contact at a first side of the electrically conducting pad, and a passivation layer covering the electrically conducting pad; forming a plurality of openings in the passivation layer; and forming a plurality of electrically conducting structures in the plurality of openings and in contact with a second side of the electrically conducting pad, the contact of the plurality of electrically conducting structures with the electrically conducting pad being offset with respect to the contact of the TSV with the electrically conducting pad.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION

Figure 1:
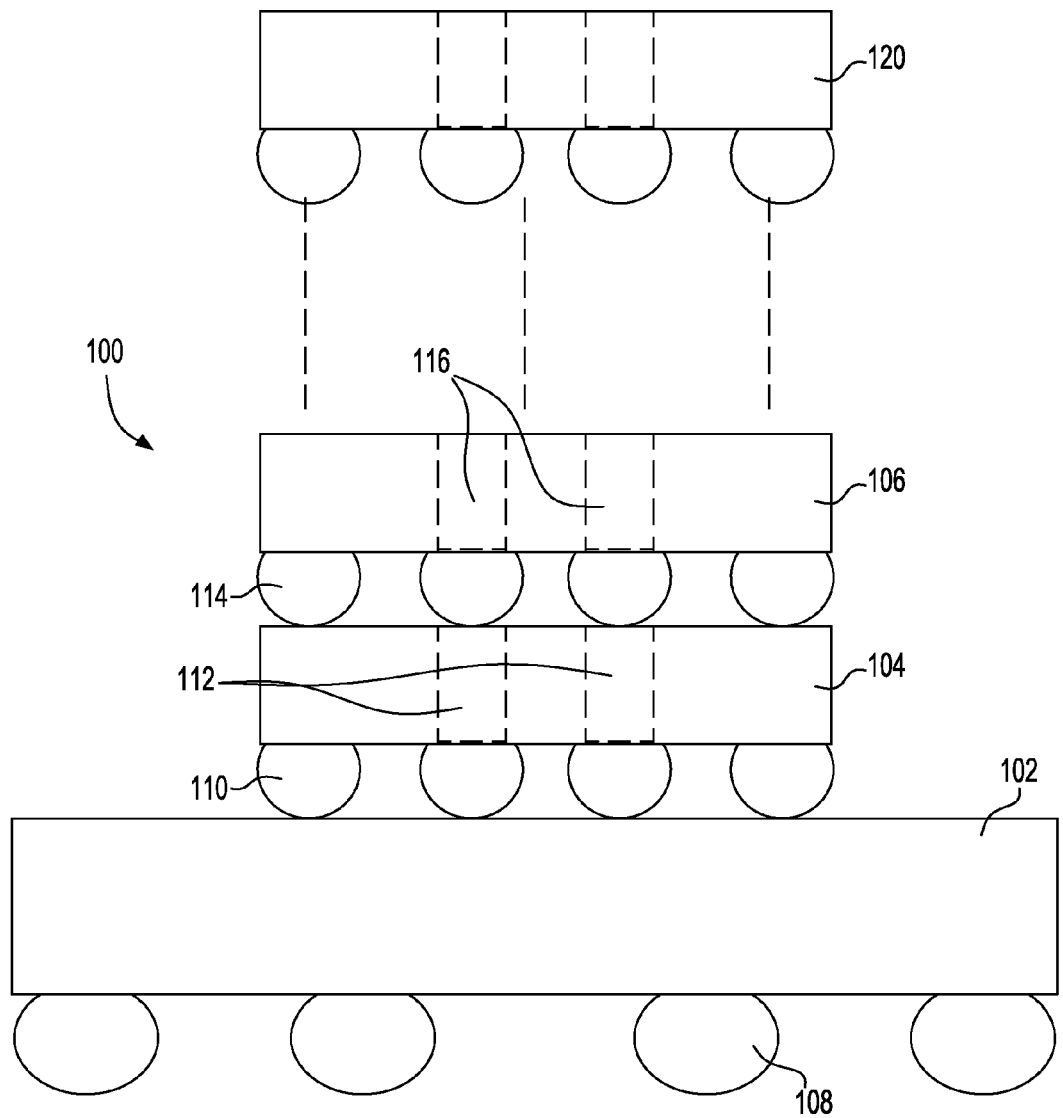
FIG. 1 depicts a conventional three-dimensional (3-D) semiconductor integrated structure.

Referring to the Figures in more detail, and particularly referring to FIG. 1, there is shown a conventional 3-D semiconductor integrated structure 100 which may include an interconnect structure or package 102, a first semiconductor chip 104 joined to the package 102 and at least one additional semiconductor chip 106 stacked on the first semiconductor chip 104.

The package 102 may be any conventional semiconductor package including plastic packages, FR-4 packages and ceramic packages. On the bottom of package 102 may be solder balls 108 for joining to the next level of packaging such as a motherboard. On the top of the package 102 there may be pads (not shown) for receiving the first semiconductor chip 104. It should be understood that while the 3-D integrated structure 100 includes a package 102, the presence or absence of a package of any type is not important to the exemplary embodiments.

First semiconductor chip 104 may include solder balls for connecting semiconductor chip 104 to the pads (not shown) on package 102. Semiconductor chip 104 may also include one or more through TSVs 112 for providing power or signal connections between package 102 and second semiconductor chip 106.

Stacked on first semiconductor chip 104 is second semiconductor chip 106 which may also have solder balls 114 for connecting second semiconductor chip 106 to pads (not shown) on first semiconductor chip 104. Second semiconductor chip 106 may also have one or more TSVs 116 for providing power or signal connections between first semiconductor chip 104 and any additional semiconductor chips 120 that may be present in the 3-D semiconductor integrated structure 100. Any additional semiconductor chips 120 may also have such TSVs.

Figure 2:
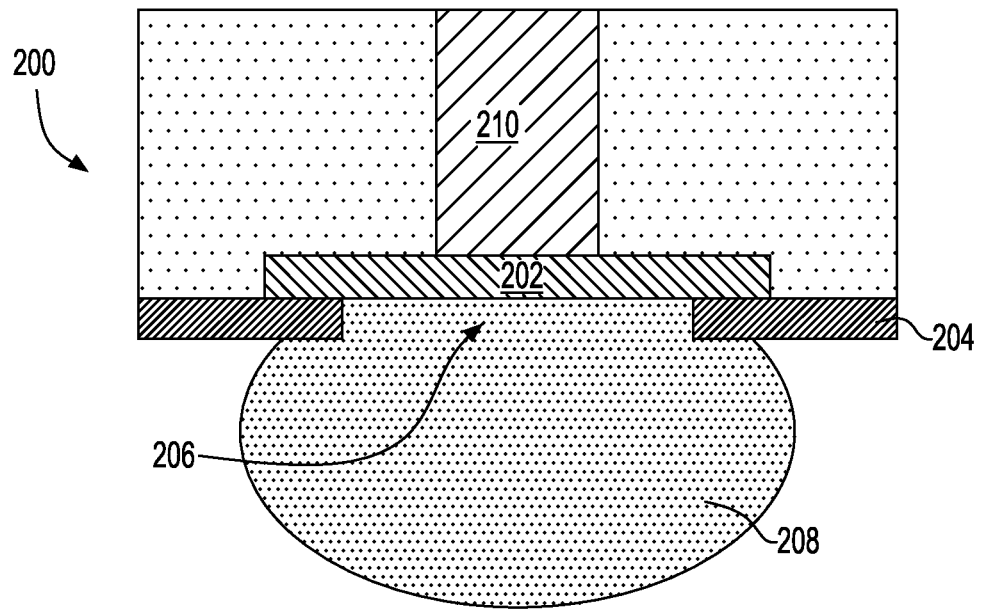
FIG. 2 is a cross-sectional view of a conventional semiconductor chip that may be used in the 3-D integrated structure of FIG. 1.

Referring now to FIG. 2, there is shown an enlarged cross-sectional view of a conventional semiconductor chip 200. The semiconductor chip 200 may be any of the semiconductor chips shown in FIG. 1 but for purposes of illustration and not limitation, semiconductor 200 depicts a portion of first semiconductor chip 104. Semiconductor chip 200 may include a bonding pad 202, a passivation layer 204 that defines an opening 206 over the bonding pad 202 and solder ball 208 for joining semiconductor chip 200 to a package or another semiconductor chip. The materials that comprise the bonding pad 202 and the passivation layer 204 may typically be metallic materials (for example, copper) and nonmetallic materials (for example, nitride or oxide), respectively, and are not important to the exemplary embodiments.

Semiconductor chip 200 further includes a TSV 210 that terminates at one end on a first side of the bonding pad 202. The TSV 210 at another end may also terminate at a bonding pad (not shown). The opening 206 is on a second side of the bonding pad 202. It should be noted that the footprint of TSV 210 aligns with the approximate center of opening 206 as best seen in FIG. 3.

Figure 3:
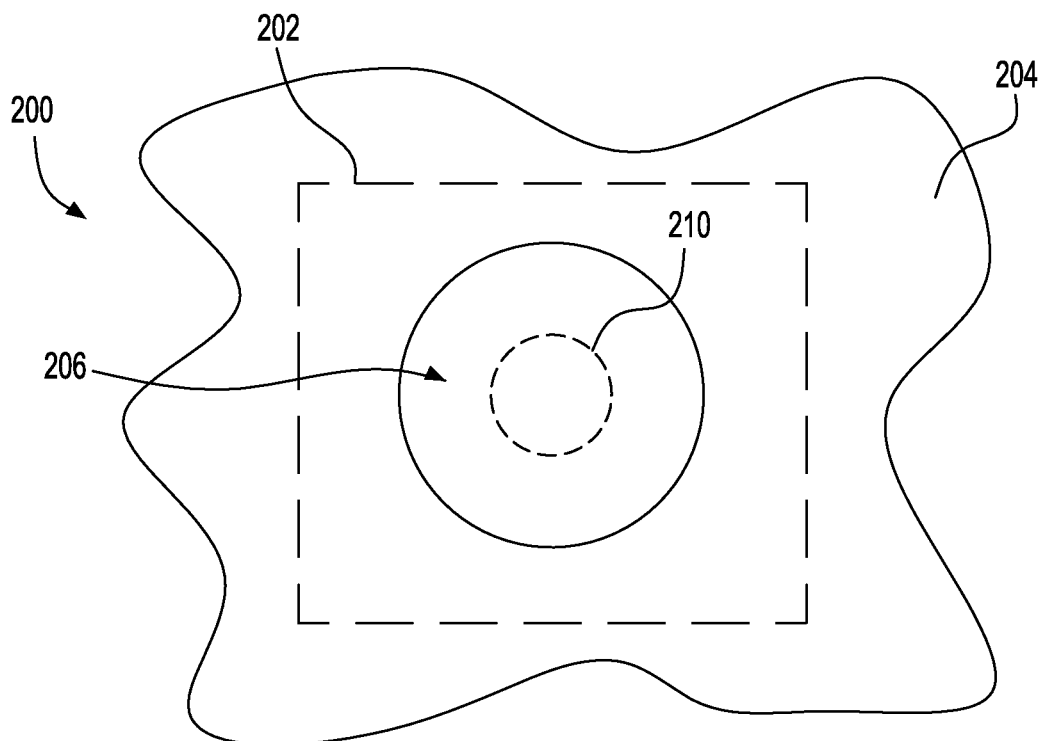
FIG. 3 is a bottom view of the conventional semiconductor chip of FIG. 2 with the solder ball removed.

FIG. 3 illustrates a bottom view of semiconductor chip 200 with the solder ball 208 removed. Opening 206 of passivation layer 204 exposes bonding pad 202 for joining with the solder ball 208. The footprint of TSV 210, shown in phantom, is within the opening 206.

The design of semiconductor chip 200 results in high current density on bonding pad 202 which can lead to electromigration problems.

Electromigration and high currents in chip to chip and chip to package connections can be a problem in high power microelectronics. The problem may be exacerbated in 3D semiconductor integrated structures because the bottom chip may carry all the power for all the other chips in the stack. Another problem in 3D semiconductor integrated structures may be that the TSV is frequently aligned directly under a pad. Current gets concentrated to the TSV area because there is little wiring between the outer layer of the chip and the terminated end of the TSV.

The exemplary embodiments have been designed to address the electromigration problems of conventional 3-D semiconductor integrated structures.

Figure 4:
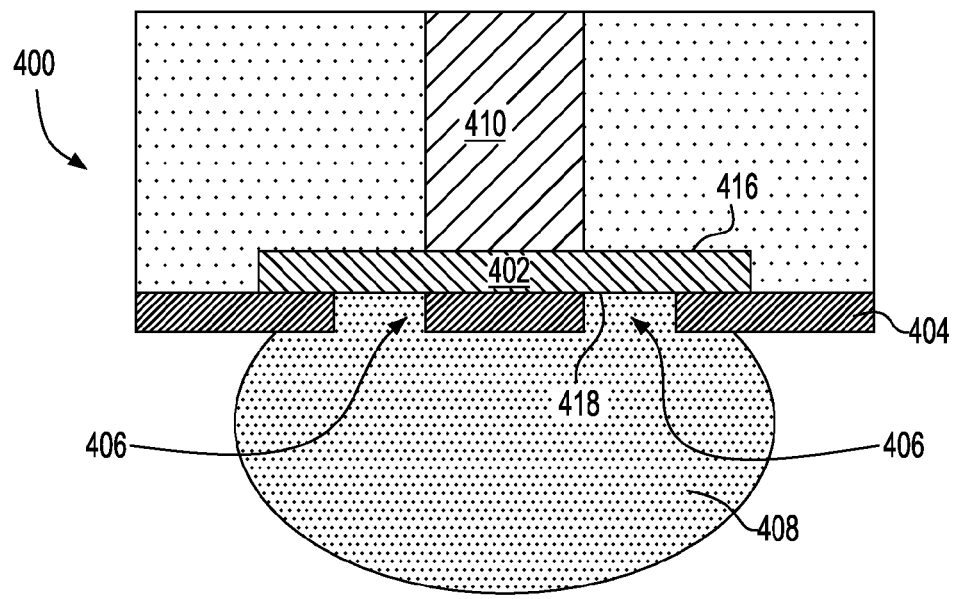
FIG. 4 is a cross-sectional view of an exemplary embodiment of a semiconductor chip that may be used in the 3-D integrated structure of FIG. 1.

Referring now to FIG. 4, there is shown an enlarged cross-sectional view of an exemplary embodiment of a semiconductor chip 400. The semiconductor chip 400 may be substituted for any or all of the semiconductor chips shown in FIG. 1. It is most preferred that semiconductor chip 400 be the bottom chip of a 3-D semiconductor integrated structure since that is where current density on the bonding pad may be the highest and thus electromigration the greatest. Semiconductor chip 400 may include a bonding pad 402, a passivation layer 404 that defines openings 406 over the bonding pad 402 and solder ball 408 for joining semiconductor chip 400 to a package or another semiconductor chip. The materials that comprise the bonding pad 402 and the passivation layer 404 may typically be metallic materials (for example, copper) and nonmetallic materials (for example, nitride or oxide), respectively, and are not important to the exemplary embodiments.

Figure 5:
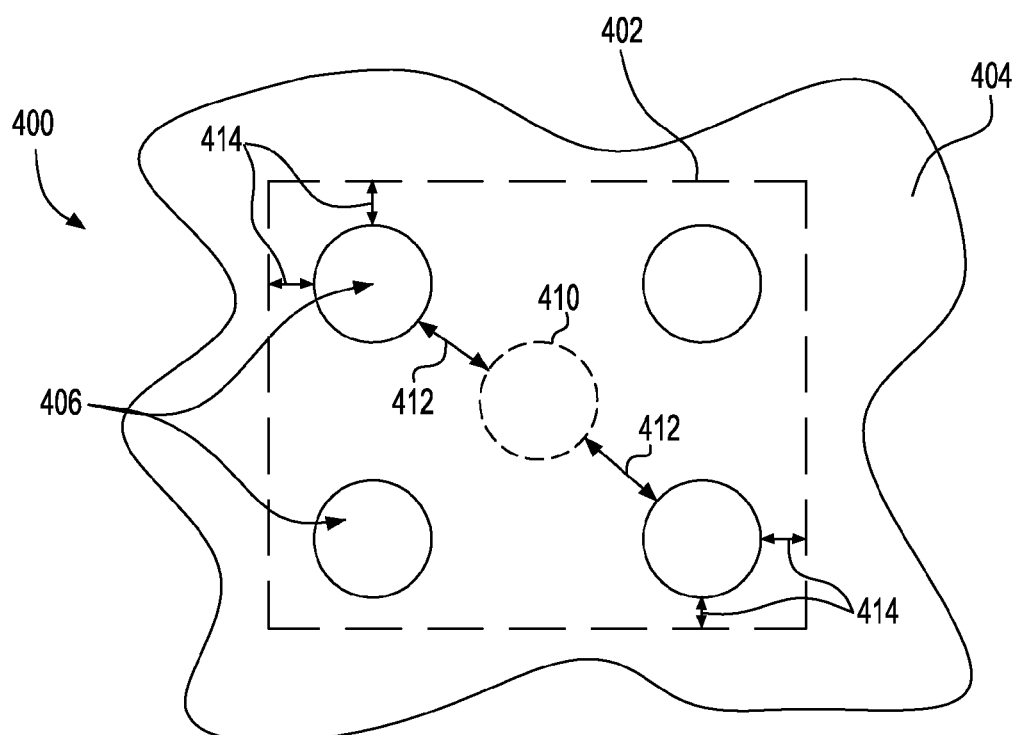
FIG. 5 is a bottom view of the semiconductor chip of FIG. 4 with the solder ball removed.

Semiconductor chip 400 further includes a TSV 410 that terminates at one end on a first side 416 of the bonding pad 402. The TSV 410 at another end may also terminate at a bonding pad (not shown). The openings 406 are on a second side 418 of the bonding pad 402. In the exemplary embodiments, the footprint of TSV 410 is offset from the openings 406 as best seen in FIG. 5. The footprint of the TSV 410 may be defined as the area of contact on the first side 416 bonding pad 402 juxtaposed to the second side 418 of the bonding pad 402 as if the TSV 410 was in contact with the second side 418 of bonding pad 402.

FIG. 5 illustrates a bottom view of semiconductor chip 400 with the solder ball 408 removed. Openings 406 of passivation layer 404 expose bonding pad 402 for joining with the solder ball 408. The footprint of TSV 410, shown in phantom, is offset from the openings 406 and is covered by passivation layer 404. For purposes of illustration and not limitation, there are four openings 406 shown in FIG. 5. There may be more than four openings 406 or less than four openings 406 but at a minimum there should be at least two such openings 406.

The openings 406 may be symmetrically located around the footprint of TSV 410. That is, openings 406 may be equally spaced from the footprint of TSV 410 by a dimension as indicated by arrows 412 as well as equally spaced from the edges of bonding pad 402 by a dimension as indicated by arrows 414. The openings 406 must be spaced at least some distance 412 from the footprint of TSV 410 to avoid concentration of current leading to exacerbation of electromigration issues.

According to the exemplary embodiments, current from the TSV 410 will exit at the bonding pad 402, travel transversely (horizontally) along the bonding pad 402 and then out through the openings 406 into the solder ball 408. Thus, any concentration of current where the TSV 410 contacts the bonding pad 402 may be avoided.

For purposes of illustration and not limitation, the TSV 410 may have a diameter of about 20 micrometers and therefore also a footprint of about 20 micrometers on the second side 418 of bonding pad 402. For purposes of illustration and not limitation, the four openings 406 shown in FIG. 5 may then have a diameter of about 18 micrometers, be spaced from the footprint of TSV 410 by about 5 micrometers (dimension 412 in FIG. 5) and be spaced from the edges of the bonding pad 402 by about 4 micrometers (dimension 414 in FIG. 5).

With the teachings of the present invention, a person skilled in the art may choose the optimum size of the openings 406, spacing from the footprint of the TSV 410 (dimension 412) and spacing from the edges of the bonding pad 402 (dimension 414). Again, to avoid any concentration of current into the center of the bonding pad 402, dimension 412 must not be zero or negative such that the openings contact or overlap with the footprint of the TSV 412.

Figure 6:
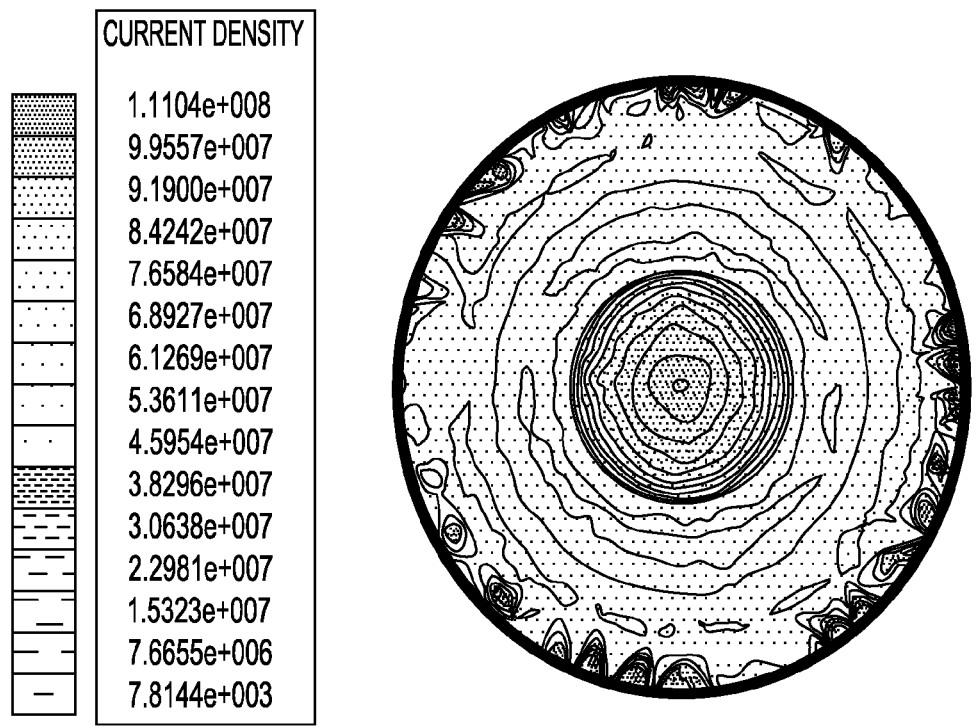
FIG. 6 depicts electromigration modeling for the conventional semiconductor chip of FIGS. 2 and 3.

Electromigration modeling was conducted for a design wherein the opening in the passivation layer was directly over the footprint of the TSV similar to the conventional design shown in FIGS. 2 and 3. The TSV was assumed in the simulation to have a current of 300 mA (milliamps) and a diameter of 20 µm (micrometers). The opening in the passivation layer over the TSV had a diameter of 45 µm. The results of the electromigration modeling are shown in FIG. 6. The legend box to the left of FIG. 6 indicates the current density at various points across FIG. 6 with the current density being highest in the center of FIG. 6. The bonding pad in FIG. 6 had a maximum current density of 112 $\mu A/\mu m^2$ (microamps per micrometer squared) for a 300 mA current, or 56 $\mu A/\mu m^2$ for a 150 mA current, with the current concentrated in the center of the bonding pad.

Figure 7:
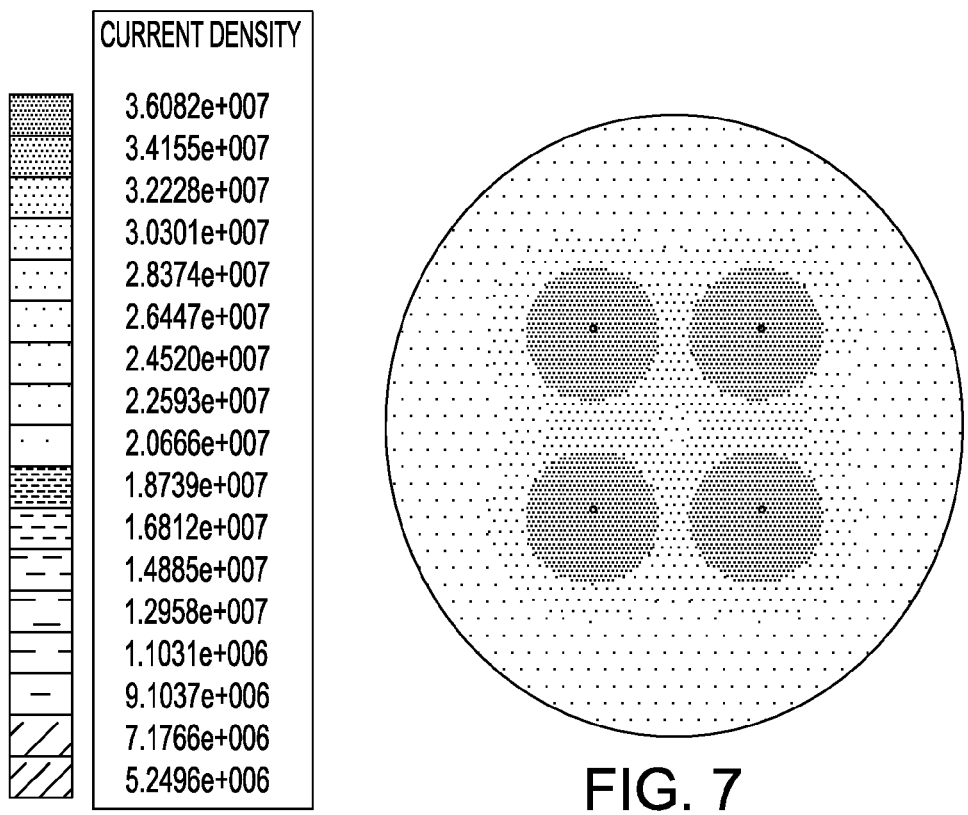
FIG. 7 depicts electromigration modeling for an exemplary embodiment of the semiconductor chip of FIGS. 3 and 4.

Further electromigration modeling was conducted for a design having four openings in the passivation layer offset from the footprint of the TSV, similar to the exemplary embodiment shown in FIGS. 4 and 5. The TSV was assumed in the simulation to have a current of 150 mA and a diameter of 20 µm. The passivation layer had 4 openings having a diameter of about 18 µm with each of the openings being spaced from the footprint of the TSV (dimension 412 in FIG. 5) by about 5 µm and being spaced from the edges of the bonding pad (dimension 414 in FIG. 5) by about 4 µm. The results of the electromigration modeling are shown in FIG. 7. The box to the left of FIG. 7 indicates the current density at various points across FIG. 7 with the highest current density being offset from the center of FIG. 7. The bonding pad in FIG. 7 has a current density of 36 $\mu A/\mu m^2$ for the 150 mA current with the current being spread out more over the bonding pad.

Comparing the FIG. 6 prior art embodiment with the FIG. 7 exemplary embodiment, the current density has been reduced by about 35%.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A semiconductor structure comprising:
   a through silicon via (TSV) extending through the semiconductor structure;
   an electrically conducting pad at a surface of the semiconductor structure, the TSV terminating in direct contact at a first side of the electrically conducting pad;
   a passivation layer covering the electrically conducting pad, the passivation layer having a plurality of openings exposed to the electrically conducting pad, the plurality of openings extending entirely through the passivation layer to expose the electrically conducting pad through the plurality of openings; and
   a plurality of electrically conducting structures formed in the plurality of openings and in direct contact with a second side of the electrically conducting pad, the second side of the electrically conducting pad being opposite the first side of the electrically conducting pad, the plurality of electrically conducting structures in direct contact with the electrically conducting pad being offset with respect to the TSV in direct contact with the electrically conducting pad.

2. The semiconductor structure of claim 1 wherein the plurality of electrically conducting structures are spaced a predetermined distance from an edge of the electrically conducting pad.

3. The semiconductor structure of claim 1 wherein the plurality of electrically conducting structures are offset from the TSV by a predetermined distance.

4. The semiconductor structure of claim 1 wherein the TSV has a footprint with respect to the electrically conducting pad defined as an area of contact by the TSV on the first side of the electrically conducting pad juxtaposed to the second side of the electrically conducting pad and wherein the plurality of electrically conducting structures do not contact or overlap the TSV footprint.

5. The semiconductor structure of claim 1 wherein the plurality of electrically conducting structures comprises at least two such electrically conducting structures.

6. The semiconductor structure of claim 1 wherein a current from the semiconductor structure travels through the TSV, transversely along the electrically conducting pad a predetermined distance and then through the plurality of electrically conducting structures.

7. A semiconductor structure comprising:
   a plurality of stacked semiconductor chips in a three dimensional configuration;
   a first semiconductor chip in contact with a second semiconductor chip, the first semiconductor chip comprising;
   a through silicon via (TSV) extending through the first semiconductor chip;
   an electrically conducting pad at a surface of the first semiconductor chip, the TSV terminating in direct contact at a first side of the electrically conducting pad;
   a passivation layer covering the electrically conducting pad, the passivation layer having a plurality of openings exposed to the electrically conducting pad, the plurality of openings extending entirely through the passivation layer to expose the electrically conducting pad through the plurality of openings; and
   a plurality of electrically conducting structures formed in the plurality of openings and in direct contact with a second side of the electrically conducting pad, the second side of the electrically conducting pad being opposite the first side of the electrically conducting pad, the plurality of electrically conducting structures in direct contact with the electrically conducting pad being offset with respect to the TSV in direct contact with the electrically conducting pad.

8. The semiconductor structure of claim 7 wherein the second semiconductor chip comprising:
- a through silicon via (TSV) extending through the second semiconductor chip;
- an electrically conducting pad at a surface of the second semiconductor chip, the TSV terminating in direct contact at a first side of the electrically conducting pad;
- a passivation layer covering the electrically conducting pad, the passivation layer having a plurality of openings exposed to the electrically conducting pad to expose the electrically conducting pad through the plurality of openings; and
- a plurality of electrically conducting structures formed in the plurality of openings and in direct contact with a second side of the electrically conducting pad, the plurality of electrically conducting structures in direct contact with the electrically conducting pad being offset with respect to the TSV in direct contact with the electrically conducting pad.

9. The semiconductor structure of claim 7 wherein the plurality of electrically conducting structures are spaced a predetermined distance from an edge of the electrically conducting pad.

10. The semiconductor structure of claim 7 wherein the plurality of electrically conducting structures are offset from the TSV by a predetermined distance.

11. The semiconductor structure of claim 7 wherein the TSV has a footprint with respect to the electrically conducting pad defined as an area of contact by the TSV on the first side of the electrically conducting pad juxtaposed to the second side of the electrically conducting pad and wherein the plurality of electrically conducting structures do not contact or overlap the TSV footprint.

12. The semiconductor structure of claim 7 wherein the plurality of electrically conducting structures comprises at least two such electrically conducting structures.

13. The semiconductor structure of claim 7 wherein a current from the semiconductor structure travels through the TSV, transversely along the electrically conducting pad a predetermined distance and then through the plurality of electrically conducting structures.

14. The semiconductor structure of claim 7 wherein the plurality of electrically conducting structures make electrical contact with the second semiconductor chip.

15. The semiconductor structure of claim 7 further comprising a packaging substrate and wherein the plurality of electrically conducting structures make electrical contact with the packaging substrate.

16. A method of reducing electromigration in a semiconductor chip, the method comprising:
- obtaining a semiconductor structure comprising a through silicon via (TSV) extending through the semiconductor structure, an electrically conducting pad at a surface of the semiconductor structure, the TSV terminating in direct contact at a first side of the electrically conducting pad, and a passivation layer covering the electrically conducting pad;
- forming a plurality of openings in the passivation layer exposed to the electrically conducting pad, the plurality of openings extending entirely through the passivation layer to expose the electrically conducting pad through the plurality of openings; and
- forming a plurality of electrically conducting structures in the plurality of openings and in direct contact with a second side of the electrically conducting pad, the second side of the electrically conducting pad being opposite the first side of the electrically conducting pad, the plurality of electrically conducting structures in direct contact with the electrically conducting pad being offset with respect to the TSV in direct contact with the electrically conducting pad.

* * * * *